(12) United States Patent
Yanagi et al.

(10) Patent No.: US 10,310,000 B2
(45) Date of Patent: Jun. 4, 2019

(54) PARTIAL DISCHARGE SENSOR

(71) Applicant: Mitsubishi Electric Corporation, Tokyo (JP)

(72) Inventors: Takashi Yanagi, Tokyo (JP); Toru Fukasawa, Tokyo (JP); Takashi Ito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 278 days.

(21) Appl. No.: 15/116,596

(22) PCT Filed: Mar. 7, 2014

(86) PCT No.: PCT/JP2014/001306
§ 371 (c)(1),
(2) Date: Aug. 4, 2016

(87) PCT Pub. No.: WO2015/132821
PCT Pub. Date: Sep. 11, 2015

(65) Prior Publication Data
US 2016/0349303 A1    Dec. 1, 2016

(51) Int. Cl.
G01R 31/02 (2006.01)
G01R 31/12 (2006.01)
G01R 31/14 (2006.01)

(52) U.S. Cl.
CPC ....... *G01R 31/024* (2013.01); *G01R 31/1272* (2013.01); *G01R 31/14* (2013.01)

(58) Field of Classification Search
CPC ... G01R 31/1272; G01R 31/14; G01R 31/024
See application file for complete search history.

(56) References Cited

U.S. PATENT DOCUMENTS

| | | | | |
|---|---|---|---|---|
| 5,859,590 A | * | 1/1999 | Otani | H02H 1/0015 324/520 |
| 2011/0080161 A1 | * | 4/2011 | Maruyama | G01R 31/1254 324/122 |
| 2015/0204936 A1 | | 7/2015 | Fukasawa et al. | |

FOREIGN PATENT DOCUMENTS

| | | |
|---|---|---|
| JP | 04-004725 A | 1/1992 |
| JP | 06-331685 | 12/1994 |

(Continued)

OTHER PUBLICATIONS

S. Kaneko et al., "Detecting Characteristics of Various Type Antennas on Partial Discharge Electromagnetic Wave Radiating through Insulating Spacer in Gas Insulated Switchgear," IEEE Transaction on Dielectrics and Electrial Insulation, vol. 16, No. 5, Oct. 2009, pp. 1462-1472.

(Continued)

*Primary Examiner* — Patrick Assouad
*Assistant Examiner* — Haidong Zhang
(74) *Attorney, Agent, or Firm* — Studebaker & Brackett PC

(57) ABSTRACT

There is provided a partial discharge sensor including a first flange formed at an end of a first conductor tube, a second flange formed at an end of a second conductor tube, a first insulating spacer sandwiched between the first flange and the second flange, a plurality of holes passing through the first flange, the first insulating spacer, and the second flange, at least two first conductors each passing through one of the plurality of holes to be disposed with electrically connected to the first flange and the second flange, a second conductor passing through one of the plurality of holes to be disposed with electrically connected to the second flange, and a second insulating spacer that insulates the second conductor and the first flange from each other.

11 Claims, 9 Drawing Sheets

(56) References Cited

FOREIGN PATENT DOCUMENTS

| | | | |
|---|---|---|---|
| JP | 2678949 | B2 | 11/1997 |
| JP | 10-4614 | A * | 1/1998 |
| JP | 10-19969 | | 1/1998 |
| JP | 2007-232496 | A | 9/2007 |
| WO | 2013/124886 | A1 | 8/2013 |

OTHER PUBLICATIONS

International Search Report dated Jun. 10, 2014 from corresponding PCT/JP2014/001306, 1 pp.
An Examination Report under Section 18(3) issued by the United Kingdom Patent Office dated Jan. 23, 2018, which corresponds to United Kingdom Patent Application No. 1614072.5 and is related to U.S. Appl. No. 15/116,596.
An Office Action issued by the Chinese Patent Office dated May 2, 2018, which corresponds to Chinese Patent Application 201480076920.X and is related to U.S. Appl. No. 15/116,596 with English language translation.

* cited by examiner

PARTIAL DISCHARGE SENSOR

TECHNICAL FIELD

The present invention relates to a partial discharge sensor of a partial discharge detection device that detects a partial discharge phenomenon that occurs inside a metal container in electric power equipment such as a gas-insulated switchgear.

BACKGROUND ART

In electric power equipment such as a gas-insulated switchgear, a high-voltage conductor (electric wire) is supported inside a metal container in which an encapsulated insulating gas is sealed and an insulation state is thereby maintained. An electric field distribution inside the metal container is designed to provide a uniform electric field, but when a defect that forms a non-uniform electric field (e.g., a metal foreign object or a needle-like protrusion) is mixed, there are cases where partial discharge occurs with a portion of the defect as a starting point. When the partial discharge is left untreated, an electrical breakdown may occur to cause an accident, and hence it is important to detect an initial stage of the partial discharge and prevent the electrical breakdown beforehand.

Accordingly, in order to detect the partial discharge, a partial discharge sensor is provided. It is known that when the partial discharge occurs, an electromagnetic wave of a VHF band to a UHF band is emitted. As a conventional partial discharge sensor, a partial discharge sensor that detects the discharge by receiving the electromagnetic wave is proposed. For example, Patent Document 1 discloses an antenna device for insulation monitoring in which a slot antenna is constituted by forming a closed loop circuit in a high-frequency manner with a pair of flanges at a junction portion of metal containers and a plurality of studs for coupling the pair of flanges, whereby an electromagnetic wave leaked from a gap of the junction portion of the metal containers to the outside is received.

CITATION LIST

Patent Document

Patent Document 1: Japanese Patent Application Laid-open No. H04-004725

SUMMARY OF THE INVENTION

Problems to be Solved by the Invention

In the partial discharge that occurs in the metal container of the electric power equipment such as the gas-insulated switchgear, the frequency of an emitted electromagnetic noise extends mainly from the VHF band to the UHF band.

However, in the antenna device for insulation monitoring in Patent Document 1, since the slot antenna is constituted by the pair of flanges at the conjunction portion of the metal containers and the plurality of studs for coupling the pair of flanges, the resonance frequency of the slot antenna is determined by an interval between adjacent studs. The slot antenna has the highest sensitivity at a frequency that provides a wavelength of L/2 with respect to its longitudinal length L, and hence there has been a problem that the wave length becomes longer than L/2 in a low frequency band like the VHF band, so that sufficiently high sensitivity cannot be obtained.

In addition, another antenna that detects the electromagnetic noise leaked from the conjunction portion of the flange to the outside may also be used, but there has been a problem that, when the antenna is configured based on ½ of the wavelength in order to obtain a sensor having high sensitivity to the electromagnetic noise in the VHF band, the size of the antenna is increased.

The present invention has been made in order to solve the above problems, and an object thereof is to provide a partial discharge sensor for low frequencies that has high sensitivity even to the electromagnetic noise in a low frequency band like the VHF band.

Means for Solving the Problems

A partial discharge sensor of the present invention includes: a first flange formed at an end of a first conductor tube; a second flange formed at an end of a second conductor tube; a first insulating spacer sandwiched between the first flange and the second flange; a plurality of holes passing through the first flange, the first insulating spacer, and the second flange; at least two first conductors each passing through one of the plurality of holes to be disposed with electrically connected to the first flange and the second flange; a second conductor passing through one of the plurality of holes to be disposed with electrically connected to the second flange; and a second insulating spacer that insulates the second conductor and the first flange from each other.

Effect of the Invention

According to the present invention, it is possible to provide the partial discharge sensor that has high sensitivity even to an electromagnetic noise in a low frequency band like the VHF band.

BEST MODE FOR CARRYING OUT THE INVENTION

Hereinbelow, a partial discharge sensor according to Embodiments of the present invention will be described in detail with reference to the drawings.

Embodiment 1

In Embodiment 1 of the invention, a description will be given of a partial discharge sensor in which a slot antenna constituted by a closed loop formed of flanges formed at ends of two conductor tubes and connecting bolts that connect the two flanges receives an electromagnetic wave emitted from a discharge source.

Figure 1:
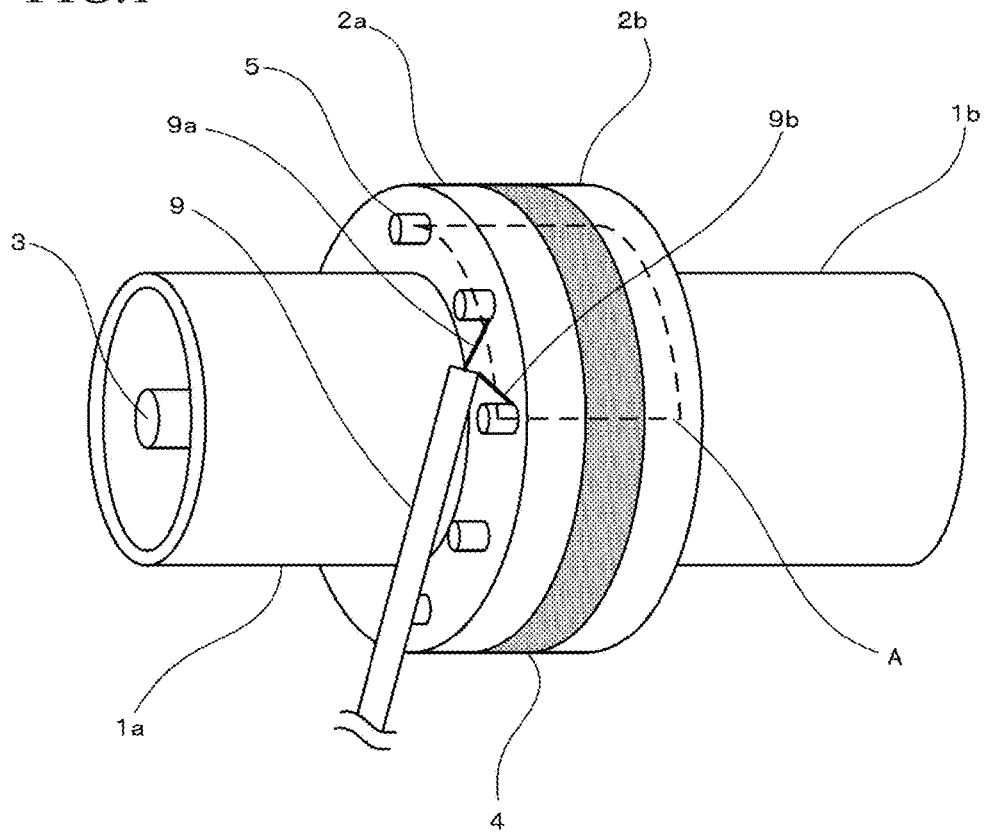
FIG. 1 is a view showing an example of a partial discharge detection device that includes a partial discharge sensor according to Embodiment 1 of the present invention.

FIG. 1 is a view showing an example of a partial discharge detection device that includes a partial discharge sensor according to Embodiment 1 of the invention.

In FIG. 1, a flange 2a (first flange) is formed at an end of a conductor tube 1a (first conductor tube). A flange 2b (second flange) is formed at an end of a conductor tube 1b (second conductor tube). A high-voltage conductor 3 is disposed in a tubular closed space constituted by the conductor tubes 1a and 1b. An insulating spacer 4 (first insulating spacer) is sandwiched between the flange 2a and flange 2b to support the high-voltage conductor 3. Connecting blots 5 fix the flange 2a, insulating spacer 4, and flange 2b to each other. A transmission line 9 (9a, 9b) includes an inner conductor and an outer conductor of a feeder, and is connected to the flanges 2a and 2b via the connecting bolts 5 to take out a signal to the outside.

Note that the conductor tubes 1a and 1b that forma cylindrical closed space as the tubular closed space are exemplified, but it does not necessarily need to be provided in the cylindrical one, and may also have a shape in cross section like a rectangular, polygon, or oval, for example. Additionally, the tubular closed space is filled with a gas that enhances insulation.

Figure 2:
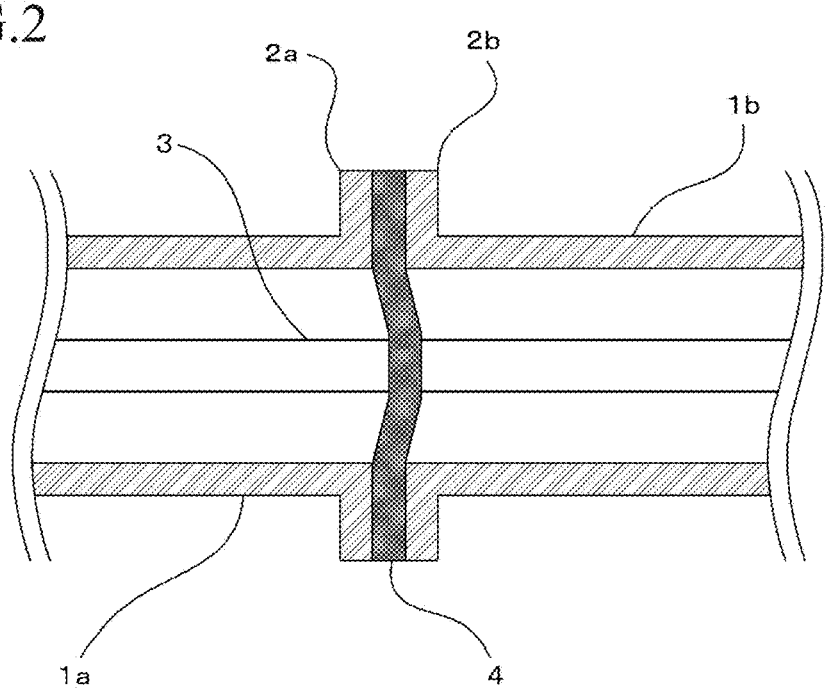
FIG. 2 is a view showing an example of a schematic configuration of a conductor tube according to Embodiment 1 of the invention.

FIG. 2 is a view showing an example of a schematic configuration of the conductor tubes according to Embodiment 1 of the invention.

As shown in FIG. 2, the high-voltage conductor 3 passes through the insulating spacer 4, and is supported by the insulating spacer 4 so as not to come in contact with an inner wall of the tubular closed space constituted by the flanges 2a and 2b as well as the conductor tubes 1a and 1b.

Figure 3:
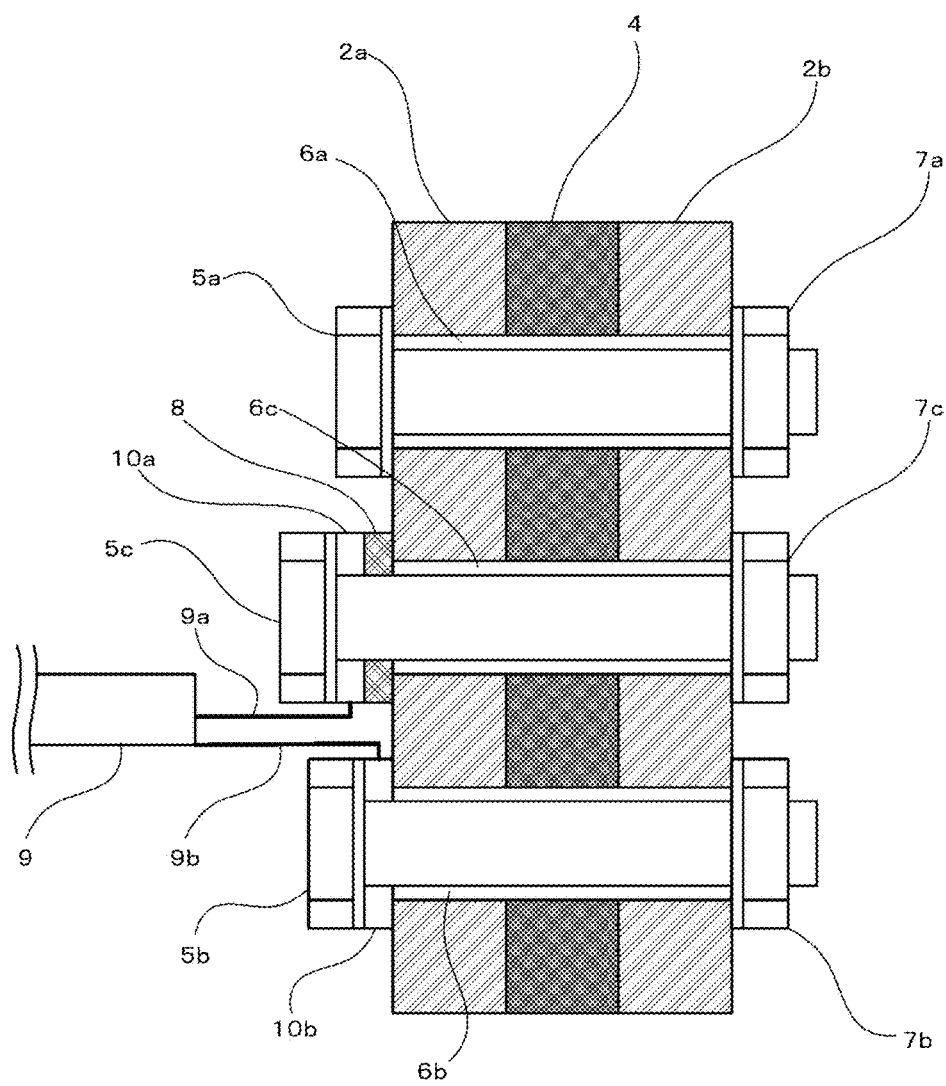
FIG. 3 is a developed view of a cross section that includes a curved surface A shown in FIG. 1.

FIG. 3 is a developed view of a cross section that includes a curved surface A shown in FIG. 1. Though the curved surface A is a curved surface along a circumference including the centers of the connecting bolts 5 that fix the flanges, it will be herein described as shown two-dimensionally.

In FIG. 3, a plurality of holes 6a to 6c are provided so as to pass through the flange 2a, insulating spacer 4, and flange 2b. Nuts 7a to 7C tighten connecting bolts 5a to 5c that pass through the holes 6a to 6c respectively to couple the flange 2a, insulating spacer 4, and flange 2b. Note that the diameters of the holes 6a to 6c are set to be respectively larger than those of the connecting bolts 5a to 5c. The diameters of the heads of the connecting bolts 5a to 5c are formed respectively larger than those of the holes 6a to 6c.

Herein, the connecting bolts 5a to 5c and the nuts 7a to 7c each are assumed to be a conductor.

Since the heads of the connecting bolts 5a and 5b (first conductors) that pass through the holes 6a and 6b are respectively larger than the holes 6a and 6b, the heads are brought into contact with the flange 2a to be in an electrically connected state. In addition, the connecting bolts 5a and 5b are respectively brought into contact with to the flange 2b by the nuts 7a and 7b to be in an electrically connected state.

An insulating spacer 8 (second insulating spacer) is inserted between the head of the connecting bolt 5c (second conductor) that passes through the hole 6c and flange 2a to prevent the connecting bolt 5c and flange 2a from being electrically connected to each other. The connecting bolt 5c is brought into contact with the flange 2b by the nut 7c to be in an electrically connected state. Note that an insulating material like the insulating spacer 8 may also be filled between the connecting bolt 5c and hole 6c.

Therefore, the connecting bolts 5a and 5b as the first conductors are brought into contact with both of the flange 2a and flange 2b to be in an electrically connected state. In addition, the connecting bolt 5c as the second conductor is not in contact with the flange 2a, and is brought into contact with only the flange 2b to be in an electrically connected state. Consequently, the closed loop formed of the flange 2a, connecting bolt 5a, flange 2b, and connecting bolt 5b constitutes the slot antenna.

The transmission line 9 is a feeder that includes the inner conductor and outer conductor (one of them is a transmission line 9a and the other is a transmission line 9b). A crimp contact 10a is formed at an end portion of the transmission line 9a, and is disposed between the head of the connecting bolt 5c and insulating spacer 8. A crimp contact 10b is formed at an end portion of the transmission line 9b, and is disposed between the head of the connecting bolt 5b and the flange 2a. A connection portion of each of the crimp contacts 10a and 10b may be, e.g., an O-shaped conductor having a ring that allows the connecting bolt to pass therethrough, or may also be a U-shaped conductor that pinches the connecting bolt from one direction.

In this regard, since the connecting bolt 5c is not electrically conducted with the flange 2a but with the flange 2b, it is possible to take out a signal of an electromagnetic wave received by the slot antenna to the outside through the transmission lines 9a and 9b. An example of the configuration of the transmission lines 9a and 9b includes a coaxial cable.

Next, an operation will be described.

In a partial discharge detection device of electric power equipment such as a gas-insulated switchgear in which the partial discharge sensor of the invention is used, a high electric field is locally generated due to, for instance, a foreign object mixed inside the conductor tubes 1a and 1b, so that partial discharge occurs. When the partial discharge occurs, a high-frequency electromagnetic wave is emitted from the discharge source of the partial discharge.

In Embodiment 1 of the invention, the slot antenna constituted by the flange 2a, connecting bolt 5a, flange 2b, and connecting bolt 5b receives the electromagnetic wave emitted from the discharge source, and transmits a reception signal thereof to the outside through the transmission lines 9a and 9b. On this occasion, the reception signal is detected as an AC voltage applied between the flange 2a and the head of the connecting bolt 5c that is an end thereof closer to the flange 2a.

When the reception signal based on the slot antenna is detected with an external measuring instrument, it is possible to detect the occurrence of the partial discharge inside the conductor tubes 1a and 1b from strength, frequency and/or the like of the reception signal.

Though the frequency of the electromagnetic wave emitted from the partial discharge differs depending on, for example, the location of the occurrence of the discharge, a signal of a VHF band to a UHF band is mainly detected therefor.

In order to obtain a signal having a high signal level with the external measuring instrument, it is necessary to increase the sensitivity of the partial discharge sensor at a predetermined frequency.

Figure 4:
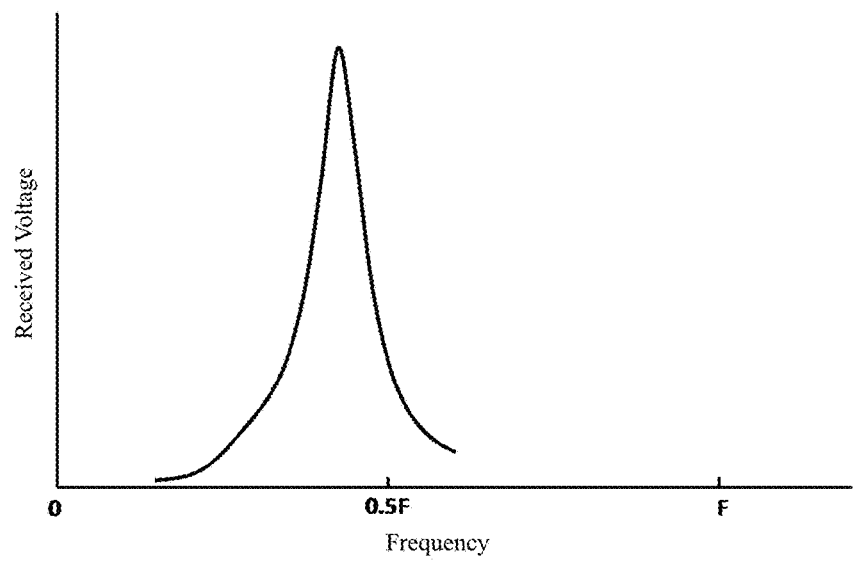
FIG. 4 is an explanatory view showing a result of calculation by simulation of a received voltage characteristic of a slot antenna constituted by a flange 2a, a connecting bolt 5a, a flange 2b, and a connecting bolt 5b of the partial discharge sensor according to Embodiment 1 of the invention.

FIG. 4 is an explanatory view showing a result of calculation by simulation of a received voltage characteristic of the slot antenna constituted by the flange 2a, connecting bolt 5a, flange 2b, and connecting bolt 5b of the partial discharge sensor according to Embodiment 1 of the invention.

It is assumed that a distance between adjacent bolts is L, and that the resonance frequency of a slot antenna in a length L is F. From FIG. 4, in Embodiment 1 of the invention, resonance occurs at a frequency corresponding to about ½ of the resonance frequency of the slot antenna in the length L, and a received voltage is raised. For example, when L=300 mm, ½F=250 MHz is satisfied, and it is possible to obtain high sensitivity even at a low frequency like the VHF band.

As described above, according to Embodiment 1 of the invention, in the slot antenna constituted by the flange 2a (first flange), the connecting bolt 5a (first conductor), the flange 2b (second flange), and the connecting bolt 5b (first conductor), it is configured that the connecting bolt 5c (second conductor) positioned between the connecting bolts 5a and 5b is insulated from the flange 2a, and that the connecting bolt 5c and the transmission line 9a are connected and that the flange 2b and the transmission line 9b are connected via the connecting bolt 5b, and hence it is possible to obtain the partial discharge sensor that has especially high sensitivity at the frequency corresponding to about ½ of the resonance frequency of the slot antenna in the length L that is the distance between the adjacent connecting bolts.

In addition, according to Embodiment 1 of the invention, it is configured that the transmission lines 9a and 9b are fixed to the connecting bolt 5c and flange 2a via the crimp contacts 10a and 10b, and hence it is not necessary to separately prepare a special structure for taking out the signal received by the slot antenna; thus, it is possible to obtain the partial discharge sensor in which effort and cost for assembling are reduced.

Note that the constitution of the transmission line 9 shown in FIGS. 1 and 3 is the coaxial cable, but the configuration thereof is not limited thereto, and it is possible to select any transmission line as long as the transmission line can take out the signal generated between the connecting bolt 5c and flange 2a.

Figure 5:
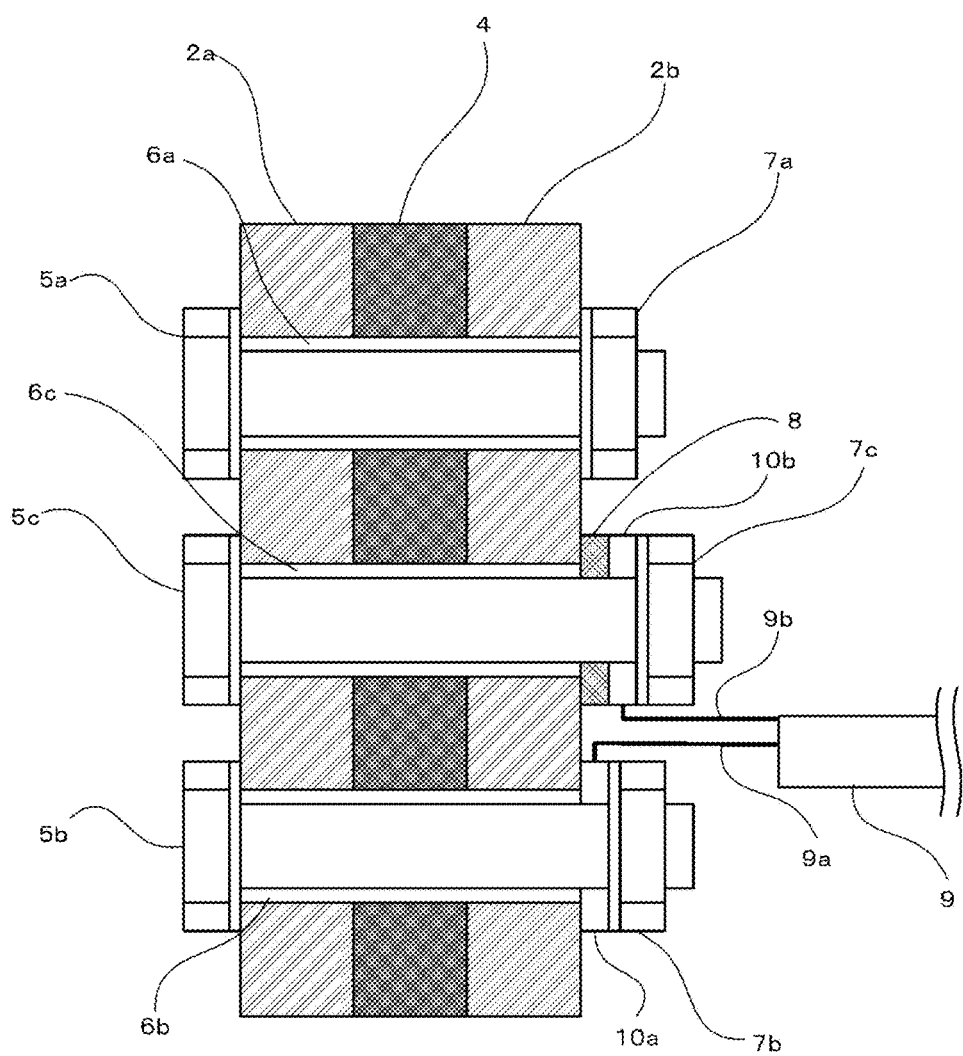
FIG. 5 is a modification in which a flange as an insulation target in the developed view shown in FIG. 3 is changed, and an insulating spacer and a crimp contact are connected.

In addition, either of the flanges 2a and 2b may be selected as one of the flanges insulated from the connecting bolt. For example, FIG. 5 is a modification in which the flange serving as an insulation target in the developed view shown in FIG. 3 is changed and the insulating spacer and the crimp contact are connected. In the drawing, when the insulating spacer 8 is inserted between the nut 7c and flange 2b, it is possible to insulate the connecting bolt 5c and the flange 2b from each other. In this case, in the slot antenna constituted by the flange 2a (first flange), connecting bolt 5a (first conductor), flange 2b (second flange), and connecting bolt 5b (first conductor), it is configured that the connecting bolt 5c (second conductor) positioned between the connecting bolts 5a and 5b is insulated from the flange 2b, and that the connecting bolt 5c and the transmission line 9b are connected, and that the flange 2b and the transmission line 9a are connected via the connecting bolt 5b, and hence, similarly to FIG. 3, it is possible to obtain the partial discharge sensor that has especially high sensitivity at the frequency corresponding to about ½ of the resonance frequency of the slot antenna in the length L that is the distance between the adjacent connecting bolts. In this regard, also in the case where the connecting bolt is inserted from the side of the flange 2b and the nut is inserted on the side of the flange 2a, even when any flange is selected as the insulation target, it is possible to dispose the insulating spacer 8 on the side of the flange to be insulated from the connecting bolt 5c to perform the connection of the crimp contacts 10a and 10b in a similar manner.

Embodiment 2

In Embodiment 1 of the invention described above, the partial discharge sensor in which the slot antenna constituted by the closed loop formed of the flange 2a, connecting bolt 5a, flange 2b, and connecting bolt 5b receives the electromagnetic wave emitted from the discharge source is described. In Embodiment 2 of the invention, a description will be given of a partial discharge sensor in which a slot antenna having an increased slot length is configured such that the connecting bolt provided between the connecting bolts 5a and 5b is insulated from the flange 2a and flange 2b.

Figure 6:
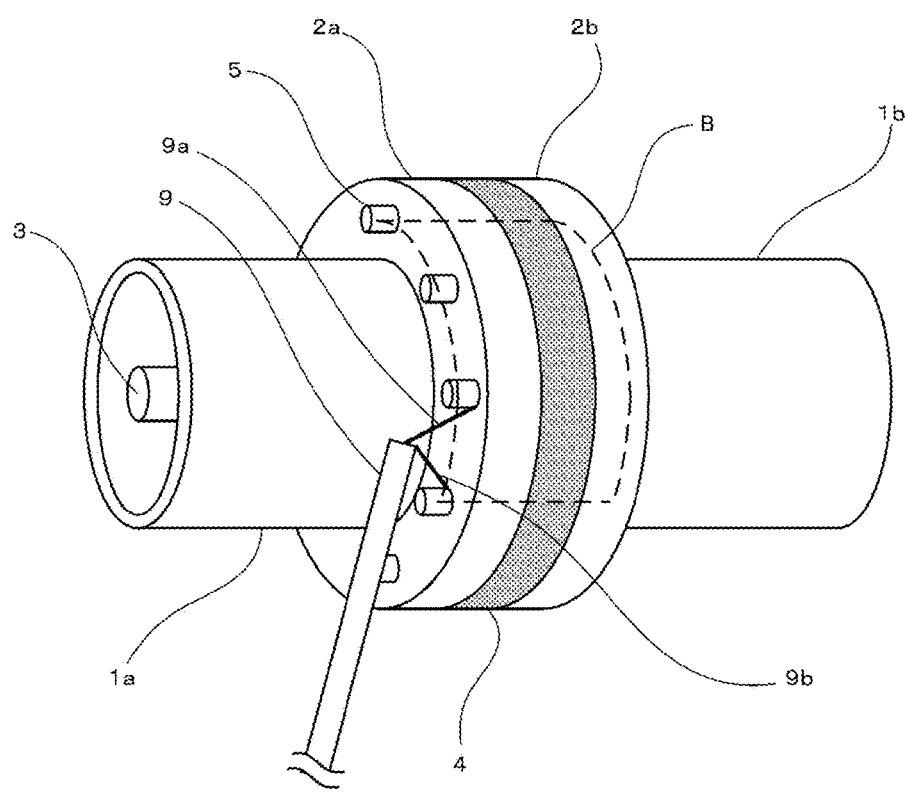
FIG. 6 is a view showing an example of a partial discharge detection device that includes a partial discharge sensor according to Embodiment 2 of the invention.

FIG. 6 is a view showing an example of a partial discharge detection device that includes the partial discharge sensor according to Embodiment 2 of the invention. In FIG. 6 illustrating an overall outline, portions identical or equivalent to those in Embodiment 1 of the invention shown in FIG. 1 are designated by the same reference numerals, and descriptions thereof will be omitted.

Figure 7:
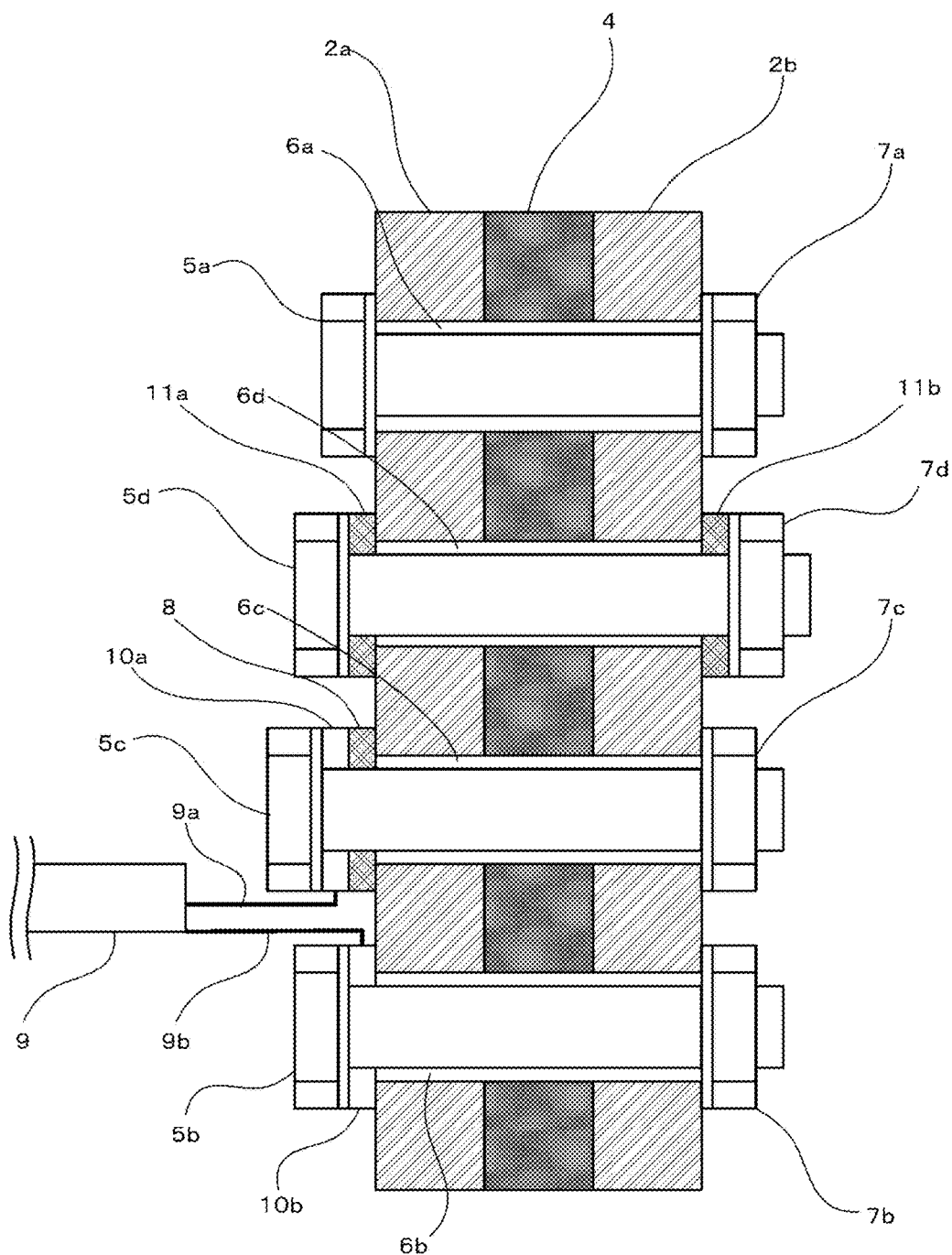
FIG. 7 is a developed view of a cross section that includes a curved surface B shown in FIG. 6.

FIG. 7 is a developed view of a cross section that includes a curved surface B shown in FIG. 6. Though the curved surface B is a curved surface along the circumference including the centers of the connecting bolts 5 that fix the flanges, it will be herein described as shown two-dimensionally. In FIG. 7, portions identical or equivalent to those in Embodiment 1 of the invention shown in FIG. 3 are designated by the same reference numerals, and descriptions thereof will be omitted.

The partial discharge sensor according to Embodiment 2 of the invention is different from the partial discharge sensor according to Embodiment 1 of the invention in that at least one connecting bolt 5d (third conductor) insulated from the flange 2a and flange 2b is provided between the connecting bolts 5a and 5b.

In Embodiment 2 of the invention, in order to insulate the connecting bolt 5d as the third conductor from the flange 2a and flange 2b, insulating spacers 11a and 11b (third insulating spacers) are provided, such that the insulating spacer 11a is inserted between the head of the connecting bolt 5d and the flange 2a, and that the insulating spacer 11b is inserted between a nut 7d and the flange 2b. In such a way, the connecting bolt 5d is secured to be prevented from being electrically connected to the flange 2a and flange 2b. Note that an insulating material like the insulating spacers 11a and 11b may also be filled between the connecting bolt 5d and a hole 6d. Consequently, a closed loop is formed of the flange 2a, connecting bolt 5a, flange 2b, and connecting bolt 5b, so that the slot antenna is constituted.

On this occasion, a slot length that is a length of the slot antenna is about three times an interval L between adjacent connecting bolts, and it is possible to achieve a slot length that is 1.5 times the slot length in Embodiment 1 of the invention. Consequently, it is possible to further lower the resonance frequency of the slot antenna by extension of the slot length.

Figure 8:
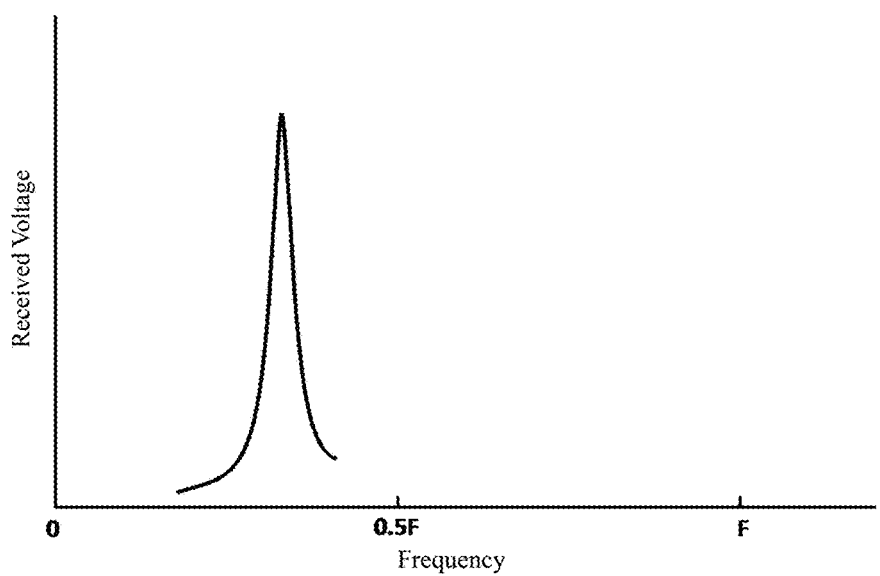
FIG. 8 is an explanatory view showing a result of calculation by simulation of a received voltage characteristic of a slot antenna constituted by a flange 2a, a connecting bolt 5a, a flange 2b, and a connecting bolt 5b of the partial discharge sensor according to Embodiment 2 of the invention.

FIG. 8 is an explanatory view showing a result of calculation by simulation of a received voltage characteristic of the slot antenna constituted by the flange 2a, connecting bolt 5a, flange 2b, and connecting bolt 5b of the partial discharge sensor according to Embodiment 2 of the invention.

From FIG. 8, it can be seen that the slot antenna of Embodiment 2 of the invention has especially high sensitivity at 0.33 F that is a frequency lower than that of the slot antenna of Embodiment 1 of the invention. Consequently, it is possible to obtain high sensitivity even at a frequency lower than that of the partial discharge sensor of Embodiment 1 of the invention.

Even when the number of the connecting bolts 5d insulated from the flanges 2a and 2b between the connecting bolts 5a and 5b is set to two or more, based on the same principle as that of the operation described above, it is possible to constitute the slot antenna having the extended slot length. In this case, when the slot length is adjusted by the number of the connecting bolts to be insulated, it is possible to change the resonance frequency of the slot antenna.

In a state in which the interval L between the adjacent connecting bolts is fixed, when the number of the connecting bolts 5c and 5d (including a connecting bolt that connects to the transmission line 9a) included between the connecting bolts 5a and 5b is represented by N, the length of the slot antenna (slot length) constituted by the flange 2a, connecting bolt 5a, flange 2b, and connecting bolt 5b is represented by Expression (1).

[Expression 1]

$$(N+1) \times L (N \text{ is a natural number of not less than 1}) \quad (1)$$

The resonance frequency of the slot antenna is the frequency at which the slot length becomes ½ of the wavelength, and hence the resonance frequency F(N) of the slot antenna in which the slot length is represented by Expression (1) is represented by Expression (2).

[Expression 2]

$$F(N) = c/(2 \times (N+1) \times L) \quad (2)$$

Herein, c is the speed of light.

With Expression (2), it is possible to lower the resonance frequency of the slot antenna by increasing the number N of the connecting bolts included between the connecting bolts 5a and 5b.

Consequently, even in the case where the interval L between the adjacent connecting bolts is reduced, it is possible to extend the slot length by increasing the number N of the connecting bolts 5c and 5d included between the connecting bolts 5a and 5b; as a result, it is possible to obtain the partial discharge sensor that has high sensitivity at a low frequency.

As described above, according to Embodiment 2 of the invention, it is configured that among a plurality of the connecting bolts disposed between the connecting bolts 5a and 5b that are the first conductors, the connecting bolt 5c that is the second conductor is insulated from the flange 2a, and that the transmission lines 9a and 9b are respectively connected to the connecting bolt 5c and the flange 2a, and that at least one connecting bolt 5d that is the third conductor to be disposed between the connecting bolts 5a and 5b other than the connecting bolt 5c is insulated from the flange 2a and flange 2b, and hence it is possible to obtain the partial discharge sensor that has especially high sensitivity at the resonance frequency represented by Expression (2). Therefore, even in the case where the interval L between the adjacent connecting bolts is reduced, it is possible to obtain the partial discharge sensor that has high sensitivity in a lower frequency band by increasing the number N of the connecting bolts 5c and 5d included between the connecting bolts 5a and 5b.

In addition, according to Embodiment 2 of the invention, similarly to Embodiment 1, it is configured that the transmission lines 9a and 9b are fixed to the connecting bolt 5c and flange 2a via the crimp contacts 10a and 10b, respectively, and hence it is not necessary to separately prepare a special structure for taking out the signal received by the slot antenna; thus, it is possible to obtain the partial discharge sensor in which effort and cost for assembling are reduced.

Note that, similarly to Embodiment 1, the constitution of the transmission line 9 is not limited to the coaxial cable, and it is possible to select any transmission line as long as the transmission line can take out the signal generated between the connecting bolt 5c and flange 2a.

Further, similarly to Embodiment 1, either of the flanges 2a and 2b may be selected as one of the flanges insulated from the connecting bolt. For example, when the insulating spacer 8 is inserted between the nut 7c and flange 2b, it is possible to insulate the connecting bolt 5c and flange 2b from each other. In this case, when the transmission lines 9a and 9b are respectively connected to the connecting bolt 5c and the flange 2a as the transmission lines, it is possible to detect a high-frequency signal with the same operation, and it is possible to obtain the partial discharge sensor that has high sensitivity in a low frequency band. In this regard, also in the case where the connecting bolt is inserted from the side of the flange 2b and the nut is inserted on the side of the flange 2a, the insulating spacer 8 may be inserted on either side of the flanges.

In addition, when a nonconductive connecting bolt (coupling member) formed of a material different from those of the other connecting bolts 5a to 5c is adopted for the connecting bolt 5d to be insulated from both of the flanges 2a and 2b, the insulating spacers 11a and 11b may be omitted.

Embodiment 3

In Embodiment 2 of the invention described above, the partial discharge sensor in which the slot antenna having the extended slot length is constituted by the connecting bolt provided between the connecting bolts 5a and 5b to be insulated from the flange 2a and flange 2b is described. In Embodiment 3 of the invention, a description will be given of a partial discharge sensor in which an antenna is constituted by insulating from the flange 2a and flange 2b all the connecting bolts other than the connecting bolt 5c to which the transmission line 9a is connected.

Figure 9:
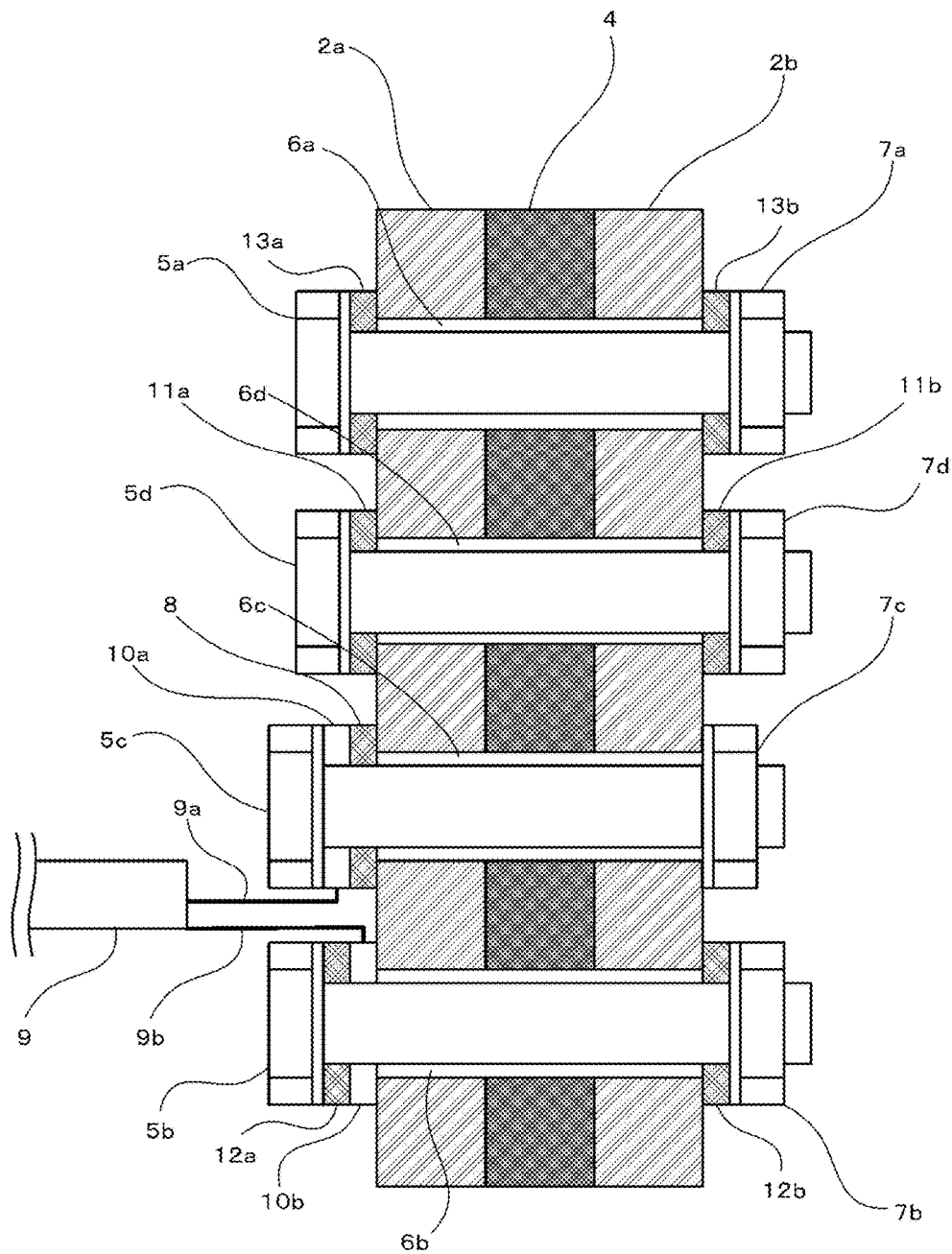
FIG. 9 is a developed view of a cross section of an example of a partial discharge detection device that includes a partial discharge sensor according to Embodiment 3 of the invention.

FIG. 9 is a developed view of a cross section as an example of a partial discharge detection device that includes the partial discharge sensor according to Embodiment 3 of the invention. The developed view corresponds to the one of the cross section shown in FIG. 7 of Embodiment 2 of the invention.

In the drawing, when all the connecting bolts other than the connecting bolt 5c to which the transmission line 9a is connected are insulated from the flange 2a and flange 2b, the partial discharge sensor that operates as a parallel plate antenna constituted by the flange 2a and the flange 2b to thus receive an electromagnetic wave emitted from a discharge source is obtained. Consequently, it is possible to detect occurrence of partial discharge by the same principle as that of the operation described in Embodiment 1 of the invention.

In this regard, in the case where all the connecting bolts 5a, 5b, and 5d other than the connecting bolt 5c are insulated from the flange 2a and flange 2b, similarly to the connecting bolt 5d in Embodiment 2 of the invention, when insulating spacers 12a, 13a are respectively inserted between the heads of the connecting bolts 5a, 5b and the flange 2a, and insulating spacers 12b, 13b are also respectively inserted between the nuts 7a and 7b and the flange 2b, the connecting bolts 5a, 5b, and 5d other than the connecting bolt 5c are prevented from being electrically connected to the flange 2a and flange 2b. A crimp contact 10a is connected between the insulating spacer 8 and connecting bolt 5c by a connection method similar to the one shown in FIG. 3 and FIG. 7 to be in a state electrically connected to only the flange 2b. On the other hand, a crimp contact 10b is connected not between the flange 2a and connecting bolt 5b but between the flange 2a and insulating spacer 12a to be in a state electrically connected to only the flange 2a. Note that an insulating material like the insulating spacer may also be filled between the connecting bolt and the hole.

In Embodiment 3 of the invention, unlike the slot antenna in each of Embodiment 1 and Embodiment 2 of the invention, the entire flanges 2a and 2b are caused to operate as the parallel plate antenna, and hence it is possible to reduce an operating frequency of the antenna lower than that of the slot antenna; thus, it is possible to obtain a discharge detection sensor that has still higher sensitivity in a low frequency band of the VHF band.

Figure 10:
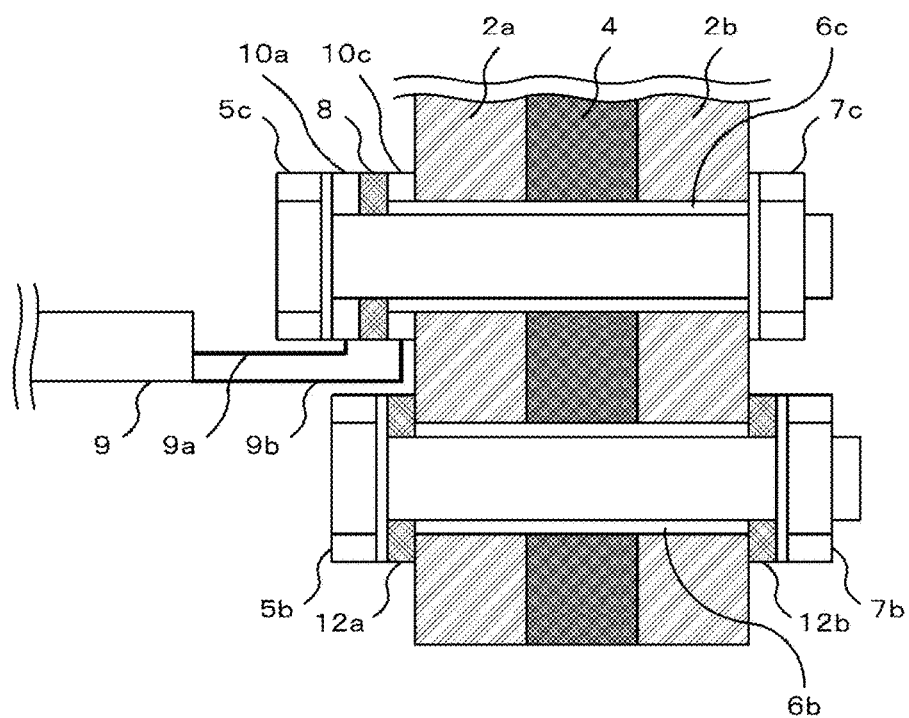
FIG. 10 is a modification of connection of a connecting bolt and a crimp contact shown in FIG. 9.

Furthermore, FIG. 10 is a modification of the connection of the connecting bolt and crimp contact shown in FIG. 9. In the drawing, in contrast to FIG. 9, the connecting bolt 5b is insulated from the flange 2a and flange 2b, similarly to the connecting bolt 5a. The crimp contact 10b disconnected from the connecting bolt 5b is connected to the flange 2b through the use of the connecting bolt 5c, but is prevented from being electrically connected to the connecting bolt 5c. Thus, for example, the crimp contact 10b is replaced with a crimp contact 10c of which the diameter is increased similarly to the diameter of the hole 6c, and the crimp contact 10c is connected between the insulating spacer 8 and flange 2a. Note that even when a large-diameter crimp contact like the crimp contact 10c is used for the crimp contact 10a, it is only necessary to secure electrical connection from the head of the connecting bolt 5c.

Note that the modification of the connection of the connecting bolt and crimp contact described in FIG. 10 can be applied to a connection of the two crimp contacts to the head side of the connecting bolt 5c in each of FIG. 3 in Embodiment 1 and FIG. 7 in Embodiment 2 when the insulating spacer 12a and the insulating spacer 12b are detached from the connecting bolt 5b. In addition, in each of Embodiments 1 to 3, as shown in FIG. 5, it is obvious that the two crimp contacts 10a and 10c can be connected to the side of the nut 7c of the connecting bolt 5c even when the connection of the crimp contact is changed from the head side of the connecting bolt to the nut side.

As described above, according to Embodiment 3 of the invention, it is constituted as the parallel plate antenna in which all the connecting bolts other than the connecting bolt 5C to which the transmission line 9a is connected are insulated from the flange 2a and flange 2b, and hence it is possible to cause the whole flanges 2a and 2b to operate as the antenna to reduce the operating frequency of the antenna lower than that of the slot antenna; thus, it is possible to obtain the discharge detection sensor that has still higher sensitivity in a low frequency band of the VHF band.

In addition, according to Embodiment 3 of the invention, similarly to Embodiment 1 and Embodiment 2 of the invention, it is configured that the transmission lines 9a and 9b are fixed to the connecting bolt and the flange via the crimp contacts 10a and 10b, and hence it is not necessary to separately prepare a special structure for taking out the signal received by the slot antenna; thus, it is possible to obtain the partial discharge sensor in which effort and cost for assembling are reduced.

Note that, similarly to Embodiment 1 and Embodiment 2 of the invention, the constitution of the transmission line 9 is not limited to the coaxial cable, and it is possible to select any transmission line as long as the transmission line can take out the signal generated between the connecting bolt 5c and flange 2a.

In addition, similarly to Embodiment 1 and Embodiment 2 of the invention, either of the flanges 2a and 2b may be selected as one of the flanges insulated from the connecting bolt. For example, when the insulating spacer 8 is inserted between the nut 7c and flange 2b, it is possible to insulate the connecting bolt 5c and flange 2b from each other. In this case, when the transmission lines 9a and 9b are respectively connected to the connecting bolt 5c and the flange 2a as the transmission lines, it is possible to detect the high-frequency signal with the same operation; thus, it is possible to obtain the partial discharge sensor that has high sensitivity in a low frequency band. Here, also in the case where the connecting bolt is inserted from the side of the flange 2b and the nut is inserted on the side of the flange 2a, the insulating spacer 8 may be inserted on either side of the flanges.

Further, when a nonconductive connecting bolt formed of a material different from that of the other connecting bolt 5c is adopted for each of the connecting bolts 5a, 5b, and 5d to be insulated from both of the flanges 2a and 2b, the insulating spacers may be omitted.

As described thus far, according to the partial discharge sensor of the invention, in the slot antenna constituted by the flange 2a, connecting bolt 5a, flange 2b, and connecting bolt 5b, it is configured that the connecting bolt 5c disposed between the connecting bolts 5a and 5b is insulated from the flange 2a, and that the transmission lines 9a and 9b are respectively connected to the connecting bolt 5c and flange 2a as the transmission lines, and hence it is possible to obtain the partial discharge sensor that has especially high sensitivity at the frequency corresponding to about ½ of the resonance frequency of the slot antenna in the length L.

In addition, according to the partial discharge sensor of the invention, it is configured that among the plurality of connecting bolts disposed between the connecting bolts 5a and 5b, the connecting bolt 5c is insulated from the flange 2a, and that the transmission lines 9a and 9b are respectively connected to the connecting bolt 5c and flange 2a, and that the N connecting bolts disposed between the connecting bolts 5a and 5b other than the connecting bolt 5c are insulated from the flange 2a and flange 2b, and hence it is possible to obtain the partial discharge sensor that has especially high sensitivity at the resonance frequency represented by Expression (2) and, even in the case where the interval L between the adjacent connecting bolts is reduced, it is possible to obtain the partial discharge sensor that has high sensitivity in a lower frequency band by an increase of the number N of the connecting bolts 5c and 5d included between the connecting bolts 5a and 5b.

Further, according to the partial discharge sensor of the invention, it is constituted as the parallel plate antenna in which all the connecting bolts other than the connecting bolt 5c to which the transmission line 9a is connected are insulated from the flange 2a and flange 2b, and hence it is possible to cause the whole flanges 2a and 2b to operate as the antenna to thus reduce the operating frequency of the antenna lower than that of the slot antenna; thus, it is possible to obtain the discharge detection sensor that has still higher sensitivity in a low frequency band of the VHF band.

In addition, according to the partial discharge sensor of the invention, it is configured that the transmission lines 9a and 9b are fixed to the connecting bolt 5c and flange 2a via the crimp contacts 10a and 10b, and hence it is not necessary to separately prepare a special structure for taking out the signal received by the slot antenna; thus, it is possible to obtain a cost-reduced partial discharge sensor.

Note that, when the partial discharge sensor of the invention is used as the partial discharge detection device of electric power equipment such as the gas-insulated switchgear, it becomes possible to early detect the partial discharge to prevent the occurrence of the electrical breakdown beforehand.

Note that it is possible to freely combine the embodiments, modify any components of the embodiments, or omit any components in the embodiments within the scope of the invention.

INDUSTRIAL APPLICABILITY

The partial discharge sensor according to the invention is capable of improving the sensitivity to reception of the electromagnetic wave in a low frequency band like the VHF band, and is suitably used as the partial discharge detection device that detects the partial discharge in the electric power equipment such as the gas-insulated switchgear.

DESCRIPTION OF REFERENCE NUMERALS AND SIGNS 1a, 1b: conductor tube
2a, 2b: flange
3: high-voltage conductor
4: insulating spacer
5, 5a to 5d: connecting bolt
6a to 6c: hole
7a to 7c: nut
8: insulating spacer
9, 9a, 9b: transmission line
10a, 10b, 10c: crimp contact
11a, 11b: insulating spacer
12a, 12b: insulating spacer
13a, 13b: insulating spacer

The invention claimed is:

1. A partial discharge sensor comprising:
a first flange formed at an end of a first conductor tube;
a second flange formed at an end of a second conductor tube;
a first insulating spacer sandwiched between the first flange and the second flange;
a plurality of holes passing through the first flange, the first insulating spacer, and the second flange;
at least two first conductors each passing through respectively first and second holes of the plurality of holes and electrically connected to both of the first flange and the second flange;
a second conductor passing through a third hole of the plurality of holes, electrically connected to the second flange, and insulated from the first flange; and
a second insulating spacer that insulates the second conductor and the first flange from each other.

2. The partial discharge sensor according to claim 1, further comprising a slot antenna in which the first flange, the second flange, and the first conductors are formed as a line.

3. The partial discharge sensor according to claim 1, further comprising at least one coupling member disposed to pass through a fourth hole of the plurality of holes, wherein
the coupling member is disposed between the first conductor and the second conductor on a circumference on which the first conductors and the second conductor are disposed.

4. The partial discharge sensor according to claim 3, wherein
the coupling member is a third conductor, and
the partial discharge sensor further comprises third insulating spacers that insulate the third conductor and the first flange from each other, and the third conductor and the second flange from each other, respectively.

5. The partial discharge sensor according to claim 1, wherein
one of an inner conductor and an outer conductor of a feeder is electrically connected to the first flange via one of the first conductors, and
the other of the inner conductor and the outer conductor of the feeder is electrically connected to the second flange via the second conductor.

6. The partial discharge sensor according to claim 5, wherein
the second conductor is a bolt that couples the first flange and the second flange,
the inner conductor and the outer conductor of the feeder each have a conductor terminal at an end thereof, and
the two conductor terminals are fixed to the first flange via the bolt with the second insulating spacer sandwiched between the two conductor terminals, by using a head of the bolt or a nut that tightens the bolt.

7. The partial discharge sensor according to claim 5, wherein
the first conductor and the second conductor are first and second bolts that couple the first flange and the second flange, respectively,
the inner conductor and the outer conductor of the feeder each have a conductor terminal at an end thereof, and
one of the two conductor terminals is fixed to the first flange via the first bolt using a head of the first bolt or a nut that tightens the first bolt, and the other of the terminals is fixed to the first flange via the second bolt using a head of the second bolt or a nut that tightens the second bolt.

8. A partial discharge sensor comprising:
a first flange formed at an end of a first conductor tube;
a second flange formed at an end of a second conductor tube;
a first insulating spacer sandwiched between the first flange and the second flange;
a first hole passing through the first flange, the first insulating spacer, and the second flange;
a first conductor passing through the first hole to be disposed with electrically connected to the second flange;
a second insulating spacer that insulates the first conductor and the first flange from each other; and
a parallel plate antenna formed of the first flange and the second flange.

9. A partial discharge sensor comprising:
a first flange formed at an end of a first conductor tube;
a second flange formed at an end of a second conductor tube;
a first insulating spacer sandwiched between the first flange and the second flange;
a first hole passing through the first flange, the first insulating spacer, and the second flange;
a first conductor passing through the first hole and disposed to be electrically connected to the second flange; and
a second insulating spacer that insulates the first conductor and the first flange from each other, wherein
one of an inner conductor and an outer conductor of a feeder is electrically connected to the first flange, and
the other of the inner conductor and the outer conductor of the feeder is electrically connected to the second flange via the first conductor.

10. The partial discharge sensor according to claim 9, wherein
the first conductor is a bolt that couples the first flange and the second flange,
the inner conductor and the outer conductor of the feeder each have a conductor terminal at an end thereof, and
the two conductor terminals are fixed to the first flange via the bolt using a head of the bolt or a nut that tightens the bolt with the second insulating spacer sandwiched between the two conductor terminals.

11. The partial discharge sensor according to claim 9, further comprising:
a second hole passing through the first flange, the first insulating spacer, and the second flange;
a second conductor disposed to pass through the second hole; and
third insulating spacers that insulate the second conductor and the first flange from each other, and the second conductor and the second flange from each other, respectively, wherein
the first conductor and the second conductor are first and second bolts that couple the first flange and the second flange,
the inner conductor and the outer conductor of the feeder each have a conductor terminal at an end thereof, and
one of the two conductor terminals is fixed to the first flange via the first bolt using a head of the first bolt or a nut that tightens the first bolt, and the other of the two conductor terminals is fixed to the first flange via the second bolt using a head of the second bolt or a nut that tightens the second bolt.

* * * * *